United States Patent [19]

Hirano et al.

[11] Patent Number: 4,731,153

[45] Date of Patent: Mar. 15, 1988

[54] METHOD TO MANUFACTURE BAPB$_{1-x}$BI$_x$O$_3$ SINGLE CRYSTAL

[75] Inventors: Shinichi Hirano, Meidai Yadacho Syukusya 123-gou, 66, Yadacho 2-chome, Higashi-ku, Nagoya, Aichi-ken; Shigeharu Naka, 11-25, Kasumigaoka 1-chome, Chigusa-ku, Nagoya, Aichi-ken, both of Japan

[73] Assignees: Shinichi Hirano; Shigehara Naka, both of Aichi; Seiko Instruments Inc., Tokyo, all of Japan

[21] Appl. No.: 837,515

[22] Filed: Mar. 7, 1986

[30] Foreign Application Priority Data

Mar. 18, 1985 [JP] Japan .................................. 60-53891

[51] Int. Cl.$^4$ .............................................. C30B 7/10
[52] U.S. Cl. ................................ 156/623 R; 156/621; 156/DIG. 70; 156/DIG. 79; 156/DIG. 85; 252/518; 252/521; 423/593
[58] Field of Search ............ 423/593; 156/621, 623 R, 156/DIG. 70, DIG. 79, DIG. 85; 252/518, 521, 623 V, 623 BT

[56] References Cited

FOREIGN PATENT DOCUMENTS 60-42298  3/1985  Japan ..................................... 423/593
60-145997 8/1985  Japan ..................................... 156/621

OTHER PUBLICATIONS

Katsui et al., Single Crystal Growth of Ba(Pb,Bi)O$_3$ from Mohen KCL Solvent, Japanese Journal of Applied Physics, vol. 21, No. 3, Mar. 1982, pp. 6157–6158.

*Primary Examiner*—Gregory A. Heller
*Assistant Examiner*—Robert M. Kunemund
*Attorney, Agent, or Firm*—Bruce L. Adams; Van C. Wilks

[57] ABSTRACT

The present invention is the method of manufacturing BaPb$_{1-x}$Bi$_x$O$_3$ single crystal utilized as a super-conductor. In this method, the starting material and the growing substrate are mounted inside an autoclave, in which an aqueous solution comprised of acid, alkali aqueous solution or peroxide is charged. With the hydrothermal synthesis that applies necessary temperature and pressure to the starting material, the BaPb$_{1-x}$Bi$_x$O$_3$ single crystal is obtained and the composition reappearance characteristic is improved. The strain is removed by growing at a temperature below the transition point. Also, by removing such defects as heat strain, the crystallization ability and super-conducting are improved.

18 Claims, 3 Drawing Figures

VARIATION OF CUBIC IMITATED LATTICE CONSTANTS a AGAINST COMPOSITION X

METHOD TO MANUFACTURE BAPB$_{1-x}$BI$_x$O$_3$ SINGLE CRYSTAL

BACKGROUND OF THE INVENTION

The present invention relates to the method of manufacturing single crystal material valuable for a super-conductive element, a semi-conductive element, or an optical electronics element which are widely utilized in the electronics industry.

BaPb$_{1-x}$Bi$_x$O$_3$ (barium lead bismuth oxide) constructed of the Perovskite structure, shows superconductivity at a range of $0.05 \leq x \leq 0.30$, semimetallic characteristic at a range of $x<0.05$, and semiconductivity at a range of $0.30<x$. Super-conductive transition temperature Tc shows 13 K. at the highest degree when x=approximately 0.25, and this degree is the highest degree in the oxide super-conductor that does not include transition metal elements, and is an extraordinary high degree in oxide super-conductors. This compound is given attention because of its super-conductivity and its composition dependency on this super-conductivity. Further, the compounds of this series include semimetallic material and its carrier density n is small, and the electron condition density N (o) at the Fermi surface is extraordinarily small as a super-conductor. Therefore, this material has a resistance rate that shows several values higher than ordinary metal super-conductors at a temperature a little higher than Tc. This is, the characteristic that is expected as an element for super-conductive switches. When this material is crystallized as a single crystal, it can get more stability, and when optically transparent crystal is obtained at the infrared rays region, it can be expected as a material for optical electronics elements at a super-low temperature.

Conventionally, growing up BaPb$_{1-x}$Bi$_x$O$_3$ single crystal is carried out by the crystallization utilizing a flux. According to one method, KCl can be utilized as the main component of the flux. KCl flux is favorable as a flux to dissolve BaPb$_{1-x}$Bi$_x$O$_3$, but to dissolve KCl and to melt KCl in BaPb$_{1-x}$Bi$_x$O$_3$, a high temperature of about 1000° C. is necessary, and thus potassium ion remains inside BaPb$_{1-x}$Bi$_x$O$_3$ single crystal, and thus the impurity density becomes large. Also, as the material grows at a temperature higher than the transition point of BaPb$_{1-x}$Bi$_x$O$_3$, the point existing in a range from of 500° C. to 600° C., crystal phase transition occurs during cooling down, and therefore, a strain largely occurs within the crystal.

There is another method utilizing PbO$_2$-Bi$_2$O$_3$-BaPbO$_3$ solution which is a non-stoichiometric compound solution. In this case, there is an advantage that the enclosure of the impurity material will lessen greatly, but, when crystallizing BaPb$_{1-x}$Bi$_x$O$_3$ from the non-stoichiometric compound, controlling the composition factor x that determines the characteristics of the material, is very difficult. Also, a strain accompanying the phase transition, occurs as stated above.

Technology of the above prior art is disclosed in the following document, Akinori Katsui; Japanese Journal of Applied Physics Vol. 21 No. 9, (1982) Page 553 to 554.

In accordance with the conventional method of manufacturing BaPb$_{1-x}$Bi$_x$O$_3$ single crystal, the impurity density within the material is large, and also, the change of composition factor x in the material is many. Also the conventional method has large problems, such as the reappearance characteristic of composition x is bad, and the phase transition occurs, and the heat strain remains because of the high temperature process at about 1000° C., and these problems are the major factors that prevent the sharp transition to the super-conductivity of the material.

SUMMARY OF THE INVENTION

The problems of the prior art, such as the impurity, the change of composition factor x and the inner strain, are caused by crystallizing BaPb$_{1-x}$Bi$_x$O$_3$ from the solution which has high viscosity and large composition change, at a very high temperature. Therefore, to solve these problems, the present invention was devised.

An object of the present invention is to provide a method to manufacture BaPb$_{1-x}$Bi$_x$O$_3$ single crystal with hydrothermal synthesis, which enables the crystal to grow at a low temperature below 500° C. where it is possible to improve the completion characteristic of the crystal avoiding its phase transition.

BRIEF DESCRIPTION OF THE INVENTION

DETAILED DESCRIPTION OF THE INVENTION

In the hydrothermal synthesis, the starting material is dissolved in a solution of an appropriate solvent at an appropriate temperature and pressure, and the intended crystal is crystallized or is grown on a suitable substrate. The growth temperature is generally from 300° C. to 600° C., and this temperature is very low as compared to the prior art method. By selecting and arranging the temperature, pressure, the kind of solvent, the controlling method of the starting material and the substrate on which the crystal is to grow, a single crystal with very little defects can be grown.

A more detailed explanation referring to several examples follows;

EXAMPLE 1

Figure 2:
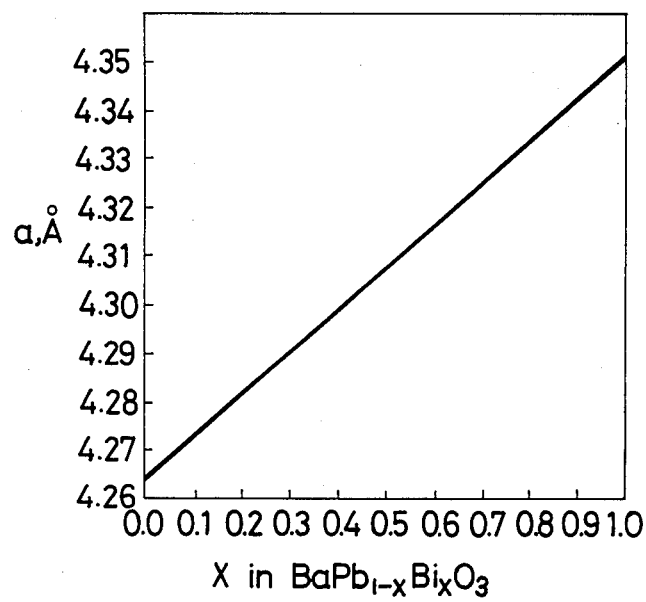
FIG. 2 is a characteristic diagram showing the variation of cubic imitated lattice constant a corresponding to composition factor x.

By utilizing available high purity reagents BaCo$_3$, PbO$_2$, Bi$_2$O$_3$ as the starting material, and conducted by conducting adjustments so that the super-conductive composition factor x=0.2, x=0.3 within BaPb$_{1-x}$Bi$_x$O$_3$ respectively. After the adjustment, the compounds are blended in a mortar and baked for one whole day at 850° C. in flow of oxygen gas. To conduct the reaction completely, the above process is repeated once again. When the above adjusted powder samples are examined by an X-ray diffractometer, the respective samples are provided to have BaPb$_{1-x}$Bi$_x$O$_3$ single phase. From the above measurement, there is a relation between lattice constant a (cubic imitated lattice constant) and composition factor x, as shown in FIG. 2. Referring to FIG. 2, the composition factors x corresponding to a are respectively x=0.21, x=0.27.

Figure 3:
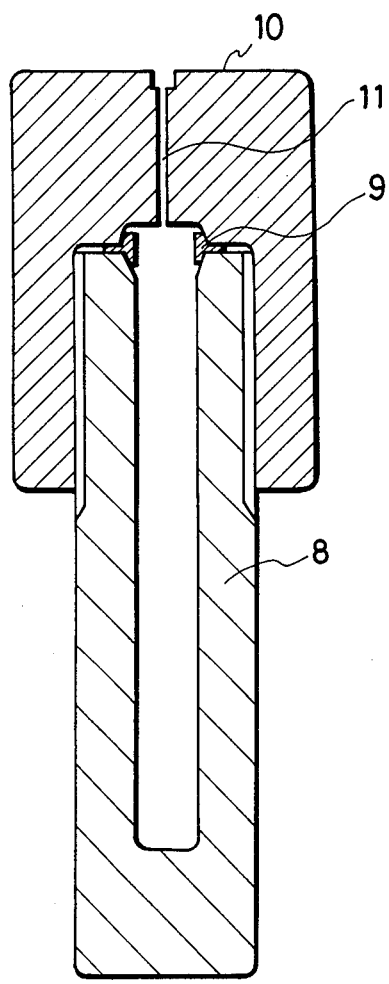
FIG. 3 is a sectional diagram showing the structure of the test tube.

For the hydrothermal process, a test tube type autoclave with the material of stelite 25 was utilized. FIG. 3 is the sectional diagram showing the structure of the autoclave. The autoclave 8 is pressure-sealed by a cover 10, through a seal ring 9. The measurement of the inner temperature of the autoclave was conducted through a temperature measuring hole 11. As the test tube of the above described structure, a gold capsule of a diameter 3 mm or a diameter 5 mm was utilized, the above adjusted sample and solvent were poured in the gold capsule, and the hydrothermal synthesis was carried out. In this case, distilled water is filled up inside the autoclave to keep the pressure balance between the inner and the outer sides of the gold capsule.

As the solvents, 3 mol NaCl aqueous solution, 3 mol KCl aqueous solution, and 3 mol NaOH aqueous solution can be utilized, and the hydrothermal process was conducted for 7 days at a pressure 1000 Kg/cm$^2$, and at a process temperature 410° to 450° C. The result is shown in table 1 where O indicates that crystallization occurs.

TABLE 1

| Sample No. | Density and the type of solvents | Whether the crystallization occurs or not |
| --- | --- | --- |
| 1 | 3 mol NaCl aqueous solution | O |
| 2 | 3 mol KCl aqueous solution | O |
| 3 | 3 mol NaOH aqueous solution | O | temperature 410 to 450° C.
pressure 1000 Kg/cm$^2$
growth period 7 days

It was observed that, with any of the above solvents, the samples were dissolved into and re-precipitated from the solutions, and crystals were grown. The same result was obtained with the respective samples of composition factor $x=0.21$, $x=0.27$. When each of the obtained crystals was powdered and examined by an X-ray diffractometer, it was observed that all of them are of BaPb$_{1-x}$Bi$_x$O$_3$ single phase. With respect to the solvents, the crystal with best crystallization characteristic and growth speed was obtained from the solvent of KCl aqueous solution.

EXAMPLE 2

By utilizing 4.5 mol KCl aqueous solution as the solvent, the same process was conducted as in Example 1, but with the process temperature at 300° to 450° C.

Table 2 shows the result where X indicates that crytallization does not occur, and O indicates that crystallization occurs.

TABLE 2

| Sample No. | Temperature of the gold capsule | | Whether the crystallization occurs or not |
| --- | --- | --- | --- |
| | Temperature of the upper part | the lower part | |
| 4 | 320° C. | 350° C. | X |
| 5 | 360° C. | 400° C. | O |
| 6 | 410° C. | 450° C. | O | solvent = 4.5 mol KCl aqueous solution
pressure = 1000 Kg/cm$^2$
growth period = 7 days When the process temperature was 350° C., neither dissolvement nor re-crystallization was observed, and the sample remained in the lower part of the gold capsule, but when the process temperature is above 400° C., the sample was dissolved and re-crystallized, and the crystal was grown and could obtain a size of about 2 mm diameter. The same result can be obtained having samples with composition factor $x=0.21$, or $x=0.27$.

When the process temperature is 450° C., larger crystal was obtained compared to the case when it was 400° C., but a twin crystal was generated sometimes, the surface was coarse and many secondary grains were attached onto the crystal. These defects are thought to occur because secondary nucleation generates during cooling down. When the obtained crystal is powdered and examined by an X-ray diffractometer, it was observed that they were all BaPb$_{1-x}$Bi$_x$O$_3$ single phase. Its composition factor could be measured in accordance with the same relation as shown in FIG. 2.

TABLE 3

| Composition factor x of adjustment or starting sample | Composition factor x of the crystal after the hydrothermal synthesis |
| --- | --- |
| 0.21 | 0.20 |
| 0.27 | 0.25 | x depends on BaPb$_{1-x}$Bi$_x$O$_3$

Therefore, $x=0.21$ changed to $x=0.20$, and $x=0.27$ changed to $x=0.25$, but the composition gap between the adjustment or starting sample and the synthesized crystal was minute.

EXAMPLE 3

Figure 1:
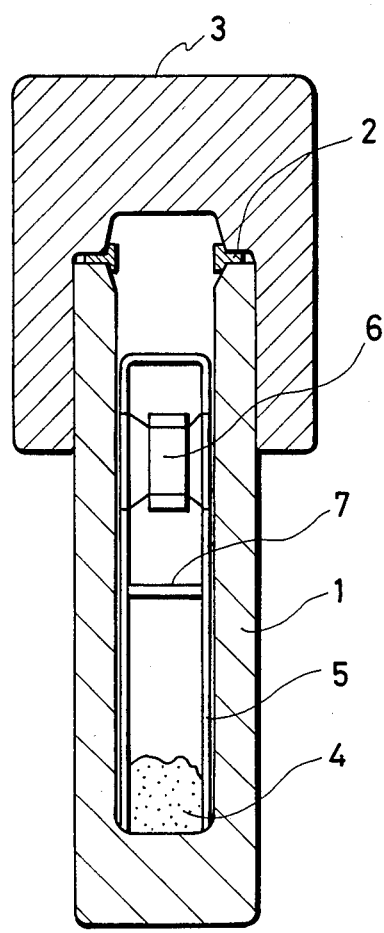
FIG. 1 is the sectional diagram showing the structure of an autoclave.

FIG. 1 is a sectional diagram showing the structure of Example 3. The autoclave is the test tube of stelite 25 as provided in Example 1, but a platinum plate inner lining is provided inside to avoid the pollution by impurities. The autoclave 1 is pressure sealed with a cover 3, through a seal ring 2. In the above structured test tube, nutrient 4 is provided at the bottom of the autoclave. This nutrient 4 was obtained by grinding and powdering BaPb$_{1-x}$Bi$_x$O$_3$ which was obtained from Example 2, the crystal being of either $x=0.20$ or $x=0.25$. Then substrate 6 is mounted on the upper part of the autoclave above the nutrient 4, through a substrate support frame 5. For the material of the substrate 6, a crystal of SrTiO$_3$ having a crystal surface (001) which has similar crystal structure and similar atom bond length is utilized, but, the crystal surface is not limited just to (001) surface, but (111) surface and (110) surface are also utilizable. The nutrient 4 and the substrate 6 are thus mounted in the autoclave and a buffer plate 7 is mounted therebetween through the substrate support frame 5. Inside the autoclave of the above structure, 4.5 mol KCl aqueous solution is charged as a solvent so that the filling rate with a determined temperature and determined pressure can be obtained. In this state, the hydrothermal process in the same condition as of Table 2 of Example 2 is processed. This condition is, temperature of substrate 6 = 360° C.
temperature of nutrient 4 = 400° C.
solvent = 4.5 mol KCl aqueous solution
pressure = 1000 Kg/cm$^2$
growth period = 7 days After the hydrothermal process, the autoclave is subjected to sudden cooling, to prevent the generation of secondary nucleation while cooling down.

As a result, a thin film with uniform thickness was formed on the substrate 6. When X-ray diffractometer was used to examine this thin film as in Example 1, the thin film was identified to be BaPb$_{1-x}$Bi$_x$O$_3$ single crystal. Referring to x, as $x=0.20$, $x=0.24$ respectively, no big change was observed as compared to the nutrient. When the super-conductive characteristic of the BaPb$_{1-x}$Bi$_x$O$_3$ thin film at $x=0.24$, was measured, it was confirmed that the thin film showed super-conductivity when the super-conductive transition was at a range of 10.0 K. to 11.7 K.

EXAMPLE 4

The formation of Example 4 is the same as Example 3 shown in FIG. 1, but with a change in the solvent.

The conditions are as follows;
temperature of substrate 6=360° C.
temperature of nutrient 4=400° C.
solvent=aqueous solution which is 4.5 mol KCl aqueous solution to which 2% of the total weight of 2.0 mol KClO$_3$ aqueous solution is added.
pressure=1000K/cm$^2$
growth period=7 days As in Example 3, quenching is carried out after the hydrothermal process. In this case, the thin film was also formed on the surface of SrTiO$_3$ crystal (001). This thin film was confirmed with X-ray to be BaPb$_{1-x}$Bi$_x$O$_3$ thin film, and its super-conductivity was similarly observed at a range of 10.0 K. to 11.7 K. at super-conductive transition temperature, but as compared to Example 3, its super-conductivity was more clear and improved.

This is because a necessary amount of peroxide such as KClO$_3$ is added to the solution, and this generates an active atmosphere of oxygen. By utilizing this generated oxygen, oxygen defficiency inside the crystal is prevented, and atom valence in the crystal is automatically controlled, and thus the movement characteristic or super-conductivity of the crystal is improved. Also in the case of KClO$_3$, after the dissolution, KClO$_3$ becomes KCl in the aqueous solution, and there is an adavantage that it does not become a factor in promoting impurities to the crystals. KClO$_3$ is not the only compound utilizable in this case, but peroxide such as potassium perchloric acid can be utilized, where the level of reaction, or adding amount are appropriately selectable.

As stated above, and as compared to the conventional flux method utilizing KCl flux or the crystallization method from the non-stoichiometric solution, in accordance with the present invention there are several beneficial effects. For example, the potassium ions are hardly kept in the crystal as impurities, because this inventive method is a process utilizing low-viscosity KCl aqueous solution at a low temperature of 400° to 450° C. Also, as the appearance or phenomenon of super-conductivity of BaPb$_{1-x}$Bi$_x$O$_3$ crystal is an important point, from the point that reappearance of the composition factor x is very efficient, this invention has a remarkable industrial advantage that the single crystal of a desired composition factor x is easily manufactured with the adjustment of the starting materials. Similarly, since the process is carried out at a low temperature of about 400° C., defects such as strain or heat strain accompanying the phase transition is very small. Therefore, a more perfect crystal can be obtained, and at the same time, by adding such compounds as peroxide into solvents, the oxygen defficiency is lessened and the atom valence is controlled, and so it is possible to improve the crystal perfection.

In accordance with the inventive method, by obtaining a complete crystal with uniform composition factor x, the improvement of super-conductivity is confirmed, and its effect is very large.

Also, because the process temperature is approximately 400° C., it is very easy to conduct hydrothermal growth of the artificial crystals or an industrial scale using existing equipment and apparatus.

As described above, in accordance with the present invention, BaPb$_{1-x}$Bi$_x$O$_3$ crystal valuable as super-conductive elements or an optical electronics element, and having more perfect characteristics with little defects can be obtained, and because this invention can offer a new manufacturing method with new industrializing possibilities, its effect is very large.

What we claim is:

1. A method of manufacturing BaPb$_{1-x}$BiO$_3$ single crystal wherein BaPb$_{1-x}$Bi$_x$O$_3$ is grown by hydrothermal synthesis which applies heat and pressure to the crystal within an aqueous solution, the hydrothermal synthesis being carried out at a temperature above 350° C.

2. The method according to claim 1; wherein the aqueous solution contains chloride or alkali.

3. The method according to claim 2; wherein said chloride is Nacl or KCl.

4. The method according to claim 2; wherein said alkali is NaOH.

5. The method according to claim 1; wherein the BaPb$_{1-x}$Bi$_x$O$_3$ single crystal is grown as a thin film on a substrate.

6. The method according to claim 5; wherein the substrate is composed of a SrTiO$_3$ single crystal.

7. The method according to claim 1; wherein the aqueous solution comprises chloride and peroxide.

8. The method according to claim 1; wherein the aqueous solution comprises KCl and KClO$_3$.

9. The method according to claim 1; including quickly cooling the BaPb$_{1-x}$Bi$_x$O$_3$ single crystal after the hydrothermal synthesis.

10. A method of manufacturing BaPb$_{1-x}$Bi$_x$O$_3$ single crystal comprising: providing a starting material comprised of BaCO$_3$, PbO$_2$ and Bi$_2$O$_3$ mixed together in the desired proportions; and hydrothermally synthesizing the starting material within an aqueous solution at a temperature above 350° C. to effect the growth of BaPb$_{1-x}$Bi$_x$O$_3$ single crystal.

11. A method according to claim 10; wherein the aqueous solution contains chloride or alkali.

12. A method according to claim 11; wherein said chloride is Nacl or KCl.

13. A method according to claim 11; wherein said alkali is NaOH.

14. A method according to claim 10; wherein the BaPb$_{1-x}$Bi$_x$O$_3$ single crystal is grown as a thin film on a substrate.

15. A method according to claim 14; wherein the substrate is composed of SrTiO$_3$ single crystal.

16. A method according to claim 10; wherein the aqueous solution comprises chloride and peroxide.

17. A method according to claim 10; wherein the aqueous solution comprises KCl and KClO$_3$.

18. A method according to claim 10; wherein the starting material is hydrothermally synthesized within the aqueous solution at a temperature below 500° C.

* * * * *